United States Patent
Chiang

(10) Patent No.: US 8,495,441 B2
(45) Date of Patent: Jul. 23, 2013

(54) METHOD FOR ADJUSTING MEMORY SIGNAL PHASE

(75) Inventor: Yung Chih Chiang, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 275 days.

(21) Appl. No.: 12/954,636

(22) Filed: Nov. 25, 2010

(65) Prior Publication Data

US 2011/0126062 A1    May 26, 2011

(30) Foreign Application Priority Data

Nov. 25, 2009    (TW) .............................. 98140169 A

(51) Int. Cl.
*G11C 29/00*    (2006.01)
(52) U.S. Cl.
USPC ......................... 714/722; 714/718; 714/821

(58) Field of Classification Search
USPC .................................. 714/722, 821, 721, 718
See application file for complete search history.

(56) References Cited

U.S. PATENT DOCUMENTS 5,251,194 A * 10/1993 Yoshimoto et al. ......... 369/44.26
7,443,740 B2 * 10/2008 Fuhrmann et al. ....... 365/189.11
7,855,909 B1 * 12/2010 Sutardja ....................... 365/148

* cited by examiner

*Primary Examiner* — Fritz Alphonse
(74) *Attorney, Agent, or Firm* — Edell, Shapiro & Finnan, LLC

(57) ABSTRACT

A method for adjusting a memory signal phase is applied to data access between a memory controller and a dynamic random access memory (DRAM) of an electronic apparatus. The method includes writing a test data into the DRAM by the memory controller in response to a predetermined status of the electronic apparatus; generating a first data strobe signal; offsetting a phase of the first data strobe signal to access and verify the test data to generate a verification result; generating a target offset value in response to the verification result; and offsetting the phase of the first data strobe signal by the target offset value for subsequent operations.

16 Claims, 3 Drawing Sheets

METHOD FOR ADJUSTING MEMORY SIGNAL PHASE

CROSS REFERENCE TO RELATED PATENT APPLICATION

This patent application is based on Taiwan, R.O.C. patent application No. 098140169 filed on Nov. 25, 2009.

FIELD OF THE INVENTION

The present invention relates to a method for adjusting a memory signal phase, and more particularly, to a method for adjusting a signal phase of a dynamic random access memory (DRAM).

BACKGROUND OF THE INVENTION

A structure of a main board of a common electronic apparatus or a computer system is composed of a central processing unit (CPU), a control chip, a system memory and peripheral circuits. The control chip controls operations between the CPU and peripheral apparatuses, e.g., data access of the system memory. DRAM, is classified as two types—a synchronous (SDRAM) and a double data rate synchronous dynamic random access memory (DDR SDRAM).

Refer to FIG. 1a showing a block diagram of a memory controller 10 and a system memory 11. For different computer systems, the memory controller 10 may reside in a control chip or a predetermined chip. When commands of a computer system are performed, memory space inside the system memory 11 is needed for temporarily storing data. For a data access process performed by the system memory 11, a read operation, a write operation or a refresh operation is controlled by the memory controller 10.

Generally, the system memory 11 is provided with a clock signal generated by the memory controller 10 to perform the access operation according to the clock signal. Under normal operations, the memory controller 10 generates a memory clock signal DCLK having a phase and a frequency synchronous with a reference clock signal CLK (not shown) to the system memory 11, which performs synchronous signal adjustment by implementing a delay-locked loop (DLL) (not shown). Upon the write operation, the memory controller 10 generates a data strobe signal DQS. Upon the read operation, the data strobe signal DQS and associated data are transmitted back to the memory controller 10, such that the control chip access the data of the system memory 11 according to the data strobe signal DQS.

The synchronous adjustment performs a delayed input and/or output detection and calibration process on the input memory clock signal DCLK by the DLL, such that a phase of the data strobe signal DQS is synchronous with that of the memory clock signal DCLK. In addition, the DLL continuously compensates the memory clock signal DCLK during the data access process to avoid the skew of the data strobe signal DQS caused by temperature increase or voltage variance of internal components when the computer system is under normal operation status.

Refer to FIG. 1b showing a timing diagram of a data signal DATA and a corresponding data strobe signal DQS. A dual data rate (DDR) system memory samples data at a rising edge and a falling edge of the data strobe signal DQS. In FIG. 1b, signal skew occurs when the phase of the data signal DATA is not aligned with that of the data strobe signal DQS. The rising edge and the falling edge of the data strobe signal DQS are present at transitions of the data signal DATA, thus data access errors occur.

Although the DLL adjusts the memory clock signal DCLK to an original extent in response to ambient variations, signal skew may occur in the data access process due to the ambient variations and uncertain factors of hardware components as components or circuits become more complicated, and thus the DLL on the electronic apparatus or the computer system operates abnormally.

For example, when a digital television (TV) operates, video signals, audio signals and on screen display (OSD) setting information need to be processed, with the signals or information being temporarily stored in a DRAM according to a predetermined priority. A program designer adjusts the phase of the data strobe signal DQS according to characteristics of the hardware components in the factory to facilitate the memory controller accessing the system memory. However, due to different characteristics of hardware components and different operating conditions, the adjusted apparatuses may abnormally operate when processing information for a long tme, and cannot continue to operate normally via original settings by the factory, e.g., image display errors or audio pop sound. The prior art adjusts one by one the apparatuses with the foregoing problems thus resulting in great inconvenience of manufactures and users.

SUMMARY OF THE INVENTION

One object of the present invention is to provide a method for adjusting a memory signal phase to reduce phase skew of a signal accessed between a memory controller and a DRAM by accessing and testing the signal via a program design of software when an electronic apparatus is in an initialization stage or an operating dynamic stage, with the phase skew being caused by different hardware components or ambient conditions.

The present invention provides a method for adjusting a memory signal phase for data access between a memory controller and a DRAM of an electronic apparatus. The method comprises writing a test data into the DRAM by the memory controller in response to a predetermined status of the electronic apparatus; generating a first data strobe signal; offseting a phase of the first data strobe signal to access and verify the test data to generate a verification result; generating a target offset value in response to the verification result; and offseting the phase of the first data strobe signal by the target offset value for subsequent operations.

BRIEF DESCRIPTION OF THE DRAWINGS

The advantages and spirit of the present invention can be further understood via the following detailed description and drawings.

DETAILED DESCRIPTION OF THE PREFERRED EMBODIMENT

Double data rate (DDR) data access performed on a DRAM may cause signal skew of a data strobe signal thereby incurring phase alignment errors between a data signal and the data strobe signal due to operating environment and hardware component characteristics. A method for adjusting a phase of a memory signal according to one embodiment of the present invention is applied to operations between a memory controller and a system memory. The present method can be applied to a main board of an electronic apparatus or a computer system to solve phase alignment errors between a data strobe signal and a data signal by hardware incorporating with a proper program.

In a first embodiment, take a digital audio/video apparatus as an example. An operating system for the digital audio/video is loaded with a program for adjusting the phase of the memory signal in this embodiment to automatically perform phase adjustment according to operation environment and various hardware component characteristics.

Figure 1A:
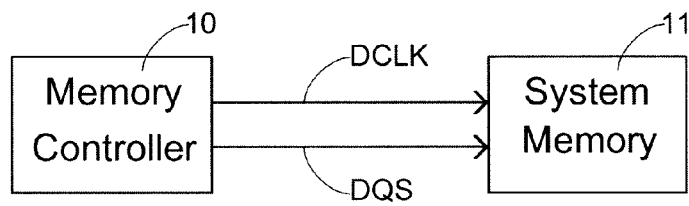
FIG. 1a is a block diagram of a memory controller and a system memory.
Figure 1B:
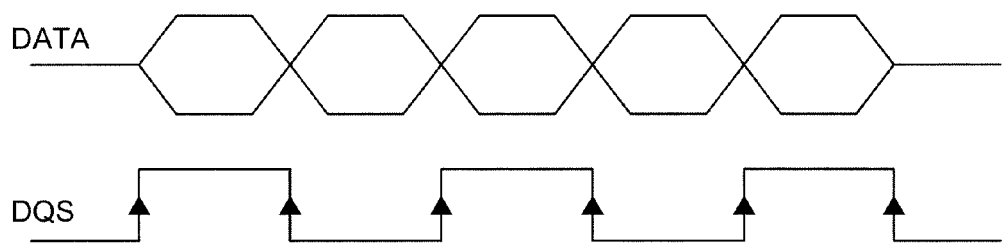
FIG. 1b shows a timing diagram of a data signal and a data strobe signal.
Figure 2:
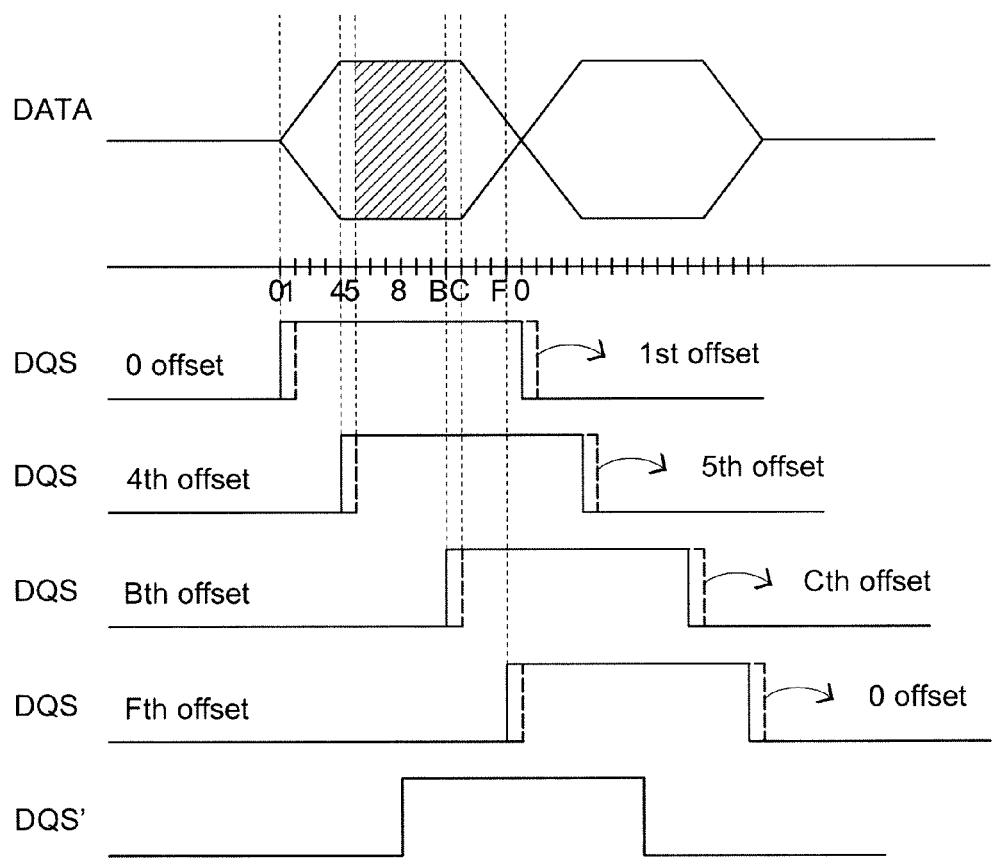
FIG. 2 is a diagram of adjusting a phase of a data strobe signal for test data in accordance with an embodiment of the present invention.
Figure 3:
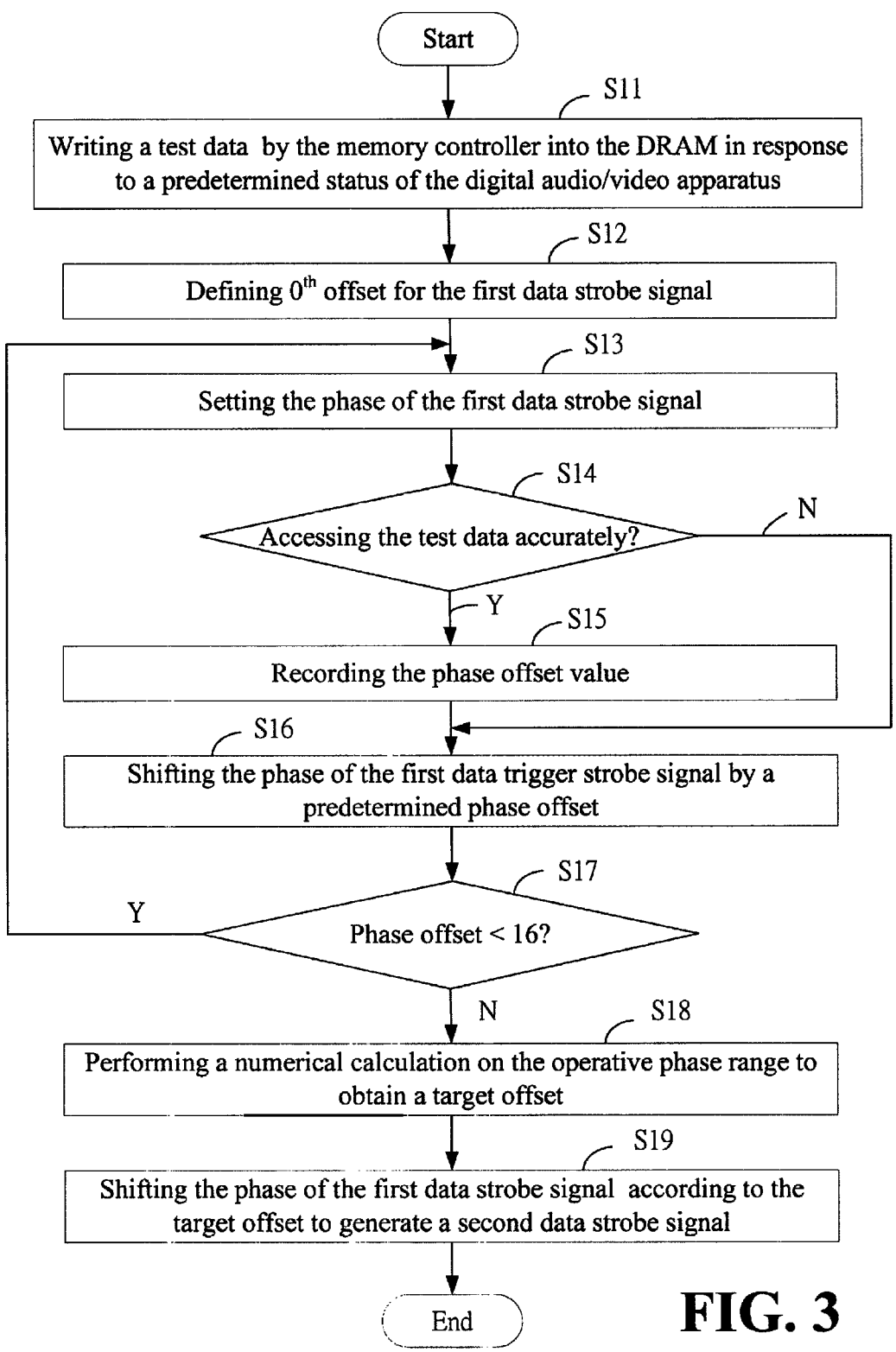
FIG. 3 is a flow chart of a method for adjusting the phase of the data strobe signal DQS in accordance with the first embodiment of the present invention.

Please refer to FIG. 2 and FIG. 3. FIG. 2 shows a diagram of continuously adjusting a phase of a first data strobe signal DQS for test data DATA in accordance with the first embodiment of the present invention. FIG. 3 is a flow chart of a method for adjusting the phase of the data strobe signal DQS in accordance with the first embodiment of the present invention.

In Step S11, in response to a predetermined status of the digital audio/video apparatus, a test data is written by the memory controller into the DRAM. The predetermined status is exemplified by an initial stage for initializing the video apparatus or an operating stage during the operating process. For the initial stage, when a user activates the digital audio/video apparatus to perform the audio/video function, the predetermined status can be a power-on test stage before the audio/video function is activated. Alternatively, similar to that in a common computer system, the predetermined status can be a power-on self test (POST) stage in the power-on operation. During the foregoing stages, no audio/video data is accessed from the DRAM.

For the operating stage during the operating process, when the predetermined status represents the digital audio/video apparatus is operating and no audio/video data is accessed by the memory controlled from the DRAM, a temperature sensed by a temperature sensor inside the apparatus is overheated. In this embodiment, the situation that the temperature sensed by the temperature sensor inside the apparatus is overheated represents that an amount of processed video data is large thereby causing temperature increase of the operating ambient or hardware components. Therefore, in this embodiment, the memory controller is designed as performing the program for adjusting the memory signal phase within an interval in which the DRAM is not accessed, e.g., a vertical blank interval (VBI) of a processed image, thereby operations of the digital audio/video apparatus are not undesirably influenced due to the program for adjusting the memory signal phase.

Furthermore, the predetermined status represents that no other audio/video access instructions are performed when the digital audio/video apparatus operates, e.g., no video signals, audio signals or setting information for on-screen display are accessed by the memory controller from the DRAM. In this embodiment, test data DATA can be implemented as several bits. Test data DATA is written into the DRAM under the predetermined status and corresponding access result associated with the signal phases for the hardware components is obtained thereafter. The method for adjusting the signal phase according to the test result in this embodiment is further described in detail.

After the test data DATA is written into the DRAM, the DRAM generates the first data strobe signal DQS, which has a frequency for the test data DATA. However, the phases for the test data DATA and the first data strobe signal DQS may be incorrect and signal skew exists. In Step S12, the digital audio/video apparatus defines the phase of the first data strobe signal DQS as a basis for subsequent process of the phase adjustment. In this embodiment, in the initial stage, a rising edge, of the first data strobe signal DQS, aligned with a transition of the test data DATA is taken as an example, and this phase of the first data strobe signal DQS is defined as a 0th offset.

In this embodiment, in Step S13, the digital audio/video apparatus sets the phase of the first data strobe signal DQS. In Step S14, access test is performed on the test data DATA from the 0th offset. For the access test, the test data DATA is verified to generate a verification result. The foregoing verification verifies accuracy of the accessed data. In subsequent steps, a recording step, a numerical calculation step and a step of generating a target offset value for the phase adjustment are performed according to the verification result. In this embodiment, the rising edge of the first data strobe signal DQS with the 0th offset positions at the transition of the test data DATA (i.e., the two signals having the same frequency also have same falling edges), it is verified that the test data DATA is inaccurate in the access test. In Step S16, when the verification result is negative, the digital audio/video apparatus then offsets the phase of the first data trigger strobe signal DQS by a predetermined phase offset. After that, the digital audio/video apparatus accesses the test data DATA according to the shifted data strobe signal DQS.

For example, the phase offset is adjusted by a predetermined value of phase offset for the first data strobe signal DQS. The phase offset changes a phase of a signal without changing the frequency of the signal. For example, the predetermined offset is defined via a hexadecimal (i.e., 0 to F) number. Each time of phase offset is performed on the first data strobe signal DQS by one step that represents $1/16$ of a width between a rising edge and an adjacent falling edge of the first data strobe signal DQS. Therefore, after 16 steps of phase offset are completed, the phase of the first data strobe signal DQS returns to the original 0th offset that corresponds to the test data DATA, so that a cycle of the phase offset is completed.

In Step S17, the phase offset status is determined. As mentioned above, the first data strobe signal DQS is offset step-by-step from the 0th to a final Fth offset. The first data strobe signal DQS returns to the original phase relationship after 16 times of phase offset. For example, whether the phase offset reach a predetermined limit is determined as the phase offset status. Provided that the phase is offset less than 16 times, the digital audio/video apparatus iterates the foregoing test step of accessing and verifying the test data DATA via the first data strobe signal DQS. Therefore, at the 0th offset, the first data strobe signal DQS is adjusted to a first offset in FIG. 2 by one step of the predetermined offset range, and at this point, the test data DATA is accessed by the adjusted phase.

Since the rising edge of the first data strobe signal DQS with the first offset corresponds to the transition period of the test data DATA, the verification result is negative. When the foregoing flow is performed, the first data strobe signal DQS offsets step-by-step from the 0th offset to the Fth offset by the phase offset process, and the test data DATA is tested and verified step-by-step. Referring to FIG. 2, when the first data strobe signal DQS is offset to a 4th offset, transition of the test data DATA is completed. Therefore, when the first data strobe signal DQS is offset to a 5th offset, it is determined that the rising edge of the first data strobe signal DQS corresponds to a phase for accurately accessing data for data access and verification. In this embodiment, when the verification of accessing the test data DATA is accurate, the phase offset value is recorded, e.g., the 5th offset is recorded (in Step S15), and the foregoing phase offset, access and verification test steps are iterated. However, in the access and verification test step, the phase at each step may be inaccurately or accurately for accessing data, such that the values representing different phases, of the first data strobe signal DQS, for accurately accessing data are recorded in a register, e.g., a 16-bit register for correspondingly recording operation statuses of 16 phases.

After the foregoing dynamic test, the digital audio/video apparatus may define an operative phase range for phases for accurately accessing data. In this embodiment, the operative phase range is from the 5th offset to a Bth offset, and the phase within the operative phase range is capable of accurately accessing the test data DATA. In the determination step, the access and verification result by offsetting the phase from a Cth offset to a next 0th offset is negative. In other words, by offsetting phases, the digital audio/video apparatus determines a range representing the phase offset of the first data strobe signal DQS for accurately accessing the stored data via the synchronous access and verification test.

In this embodiment, when the test begins, the 0th offset is aligned with the test data DATA in the transition period, and the operative phase range ranges from the 5th offset to the Bth offset. Due to characteristics of the hardware components and operating ambient conditions of the digital audio/video apparatus, a first rising edge of the first data strobe signal DQS may correspond to any position of the test data DATA when the predetermined status is present. Therefore, for different initial corresponding positions, the foregoing operative phase range is accordingly changed, e.g. from the 0th offset to a 6th offset.

After the determination step (i.e., Step S17) of the foregoing predetermined limit, when the phase offset reaches up to the predetermined limit that, i.e., when the phase is offset less than 16 times, the digital audio/video apparatus stops offsetting the phase the first data strobe signal DQS, and stops the access and verification of the test data DATA. In Step S18, the digital audio/video apparatus performs a numerical calculation on the operative phase range obtained during the phase offset and test period, e.g. the numerical calculation is arithmetic average. Although data is accurately accessed via a phase offset result within the operative phase range, access and verification errors may also occur when data is accessed by limits of the operative phase range (e.g., from the 5th offset to the Bth offset) due to the hardware component or ambient condition variations while operating the apparatus.

In this embodiment, in order to avoid possible abnormal operation of the operating system of the apparatus, a numerical calculation is performed on the operative phase range. For example, one offset is selected as a target offset from the operative phase range by excluding the boundary offsets to reduce the possibility of abnormal operation. Preferably, arithmetic average is performed on values of two boundary offsets of the operative phase range to obtain the target offset. More specifically, values 5 and 11 respectively representing the 5th offset and the Bth offset are averaged to obtain the target offset as 8. That is, the subsequent phase can be chosen as 8 hexadecimal steps with reference to the 0th offset.

In Step S19, the digital audio/video apparatus shifts the phase of the first data strobe signal DQS previously with the 0th offset by the target offset (i.e., 8) to generate a second data strobe signal DQS'. The digital audio/video apparatus accesses the data stored in the DRAM according to the second data strobe signal DQS' to operate the operating system of the apparatus.

In the first embodiment, the hexadecimal (0 to F) register is applied to implement the predetermined offset scale, the phase of the first data strobe signal DQS is offset by $\frac{1}{16}$ of a width between the rising edge and the falling edge of first data strobe signal DQS. The foregoing control chip can apply two signal pins to respectively access low-byte data or high-byte data. Each verification accesses two bytes of data each time. In the first embodiment, a signal pin DQS0 and a signal pin DQS1 can be applied for processing a low-byte 8-bit data and a high-byte 8-bit data respectively.

In the first embodiment, the approach for calculating the target offset via the arithmetic average can select a median offset of the operative phase range as the desired offset for the phase adjustment. Alternatively, one of two phase offets around the value generated by averaging the operative phase range can be determined as the target offset value.

In the first embodiment, the numerical calculation is realized by obtaining a median value via the arithmetic average. Two values around the median value within the operative phase range can also be appropriate offsets, e.g. values 7 and 9. Alternatively, the numerical calculation can be realized by a weight calculation of the two boundary values of the operative phase range. Alternatively, the lower edge value of the operative phase range is directly added by a predetermined value, or the upper edge value of the operative phase range is directly subtracted with a predetermined value to obtain the target offset value.

In a second embodiment, the complete operative phase range need not be searched for or tested in detail. In other words, 16 times of phase offset need not be completed. Instead, utilizing a hexadecimal register, the phase is continuously offset and the access and verification test is performed on the test data DATA with reference to the first data strobe signal DQS, and only one value of a first phase of the first data strobe signal DQS for accurately accessing data is recorded. For example, referring to FIG. 2, the initial phase of the first data strobe signal DQS represents the first 0th offset, and the first phase value applied to accurately access data occurs at the 5th offset. Further, the digital audio/video apparatus performs a numerical calculation on the 5th offset value. For example, the value 5 representing the 5th offset is added by a predetermined value of 2 or 3, to obtain a target offset value of 7 or 8 and thereby determining the target offset value as a phase offset value of a preferable access effect. After that, the phase of the first data strobe signal DQS is offset by the target offset value to generate a second data strobe signal DQS'.

In order to avoid possible anbnormal operations, the first embodiment and the second embodiment can be modified into a third embodiment in which a predetermined number of times of the access and verification test of the phase offset are performed after the target phase for accurately accessing data is firstly obtained. More specifically, the predetermined number is an integer, which is defined by a program designer and is smaller than the predetermined limit of the predetermined offset scale. For example, referring to FIG. 2, the first phase of the first data strobe signal DQS for accurately accessing data is the 5th offset at first. When the predetermined number of times is defined as 3, three times of phase offset and the access and verification test, including the 6th offset, the 7th offset and the 8th offset, are performed in subsequent processing.

The predetermined number of times provides an upper limit for the test. In the third embodiment, all iterations of the access and verification test of the phase need not be completely performed. Thus, samples of the operative phase range are reduced and test time is effectively reduced. In the third embodiment, the digital audio/video apparatus performs the subsequent processing similar to that in the first embodiment according to the obtained operative phase range. For example, a valid access may still be performed with the 8th offset, and thus a valid operative phase range indicates from the 5th offset to the 8th offset. The foregoing arithmetic average or weight calculation is performed on the values 5 and 8 respectively representing the 5th offset and the 8th offset to obtain the target offset, and a second data strobe signal DQS' is generated accordingly.

According to the present invention, a method for adjusting a memory signal phase is capable of effectively solving phase skew problem of signal access between a memory controller and a DRAM due to different hardware component characteristics and ambient conditions with respect to an initialization stage or an operating dynamic stage of an electronic apparatus by a program design approach of software. At this point, the solution need not be adjusted in particular by a program designer to increase convenience of manufacturers and users. Therefore, according to the present invention, the problems in the prior art are solved to improve a data access technique between the memory controller and the DRAM, and thus the main object of the present invention is achieved. The memory controller may be realized in a digital audio/video apparatus, e.g., the memory controller resides in a display controller, so as to improve a mass-production problem for matching different high-speed memories.

To sum up, according to the present invention, a method for adjusting a memory signal phase for data access between a memory controller and a DRAM in an electronic apparatus. The method comprises writing a test data into the DRAM by the memory controller in response to a predetermined status of the electronic apparatus; generating a first data strobe signal; offsetting a phase of the first data strobe signal to access and verify the test data to generate a verification result; and generating a target offset value in response to the verification result; and offsetting the phase of the first data strobe signal by the target offset value for subsequent operations.

The step of generating the target offset value, records values for phase offsets according of the verification result to generate a record result to indicate an operative phase range, and generates the target offset value according to the record result. Alternatively, a numerical calculation is performed on the values of the phase offsets to obtain the target offset value.

The step of generating the target offset value records a value of a phase offset according to the verification result, and performs a numerical calculation on the value of the phase offset to obtain the target offset value. For example, the recorded phase offset value is a first phase offset of the first data strobe signal for accurately accessing the test data.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for adjusting a memory signal phase, applied to data access between a memory controller and a dynamic random access memory (DRAM) in an electronic apparatus, the method comprises:
    writing by the memory controller a test data into the DRAM in response to a predetermined status of the electronic apparatus;
    generating a first data strobe signal;
    offsetting a phase of the first data strobe signal to access and verify the test data to generate a verification result;
    generating a target offset value in response to the verification result; and
    offsetting the phase of the first data strobe signal according to the target offset value to generate a second data strobe signal.

2. The method as claimed in claim 1, wherein the step of generating the target offset value comprises:
    recording a plurality of values of phase offsets according to the verification result to generate a record result; and
    generating the target offset value according to the record result.

3. The method as claimed in claim 1, wherein the step of generating the target offset value comprises:
    recording a plurality of values of phase offsets according to the verification result; and
    performing a numerical calculation on the recorded values when the phase offset of the first data strobe signal reaches up to a predetermined limit so as to generate the target offset value.

4. The method as claimed in claim 1, wherein the predetermined status indicates an initialization stage of the electronic apparatus.

5. The method as claimed in claim 1, wherein the predetermined status indicates a power-on self test stage.

6. The method as claimed in claim 1, wherein the predetermined status indicates that a temperature sensed by a temperature sensor of the electronic apparatus is over-heated when the DRAM is not accessed by the memory controller.

7. The method as claimed in claim 1, the electronic apparatus is a digital audio/video apparatus, and the predetermined status indicates a vertical blank interval (VBI).

8. The method as claimed in claim 3, wherein the numerical calculation is arithmetic average.

9. The method as claimed in claim 3, wherein the numerical calculation is a weight calculation.

10. The method as claimed in claim 3, wherein the predetermined limit represents an upper limit of times of phase offset within a predetermined offset scale.

11. The method as claimed in claim 3, wherein the step of recording the values of phase offsets obtains an operative phase range utilizing a value of phase offset for the first data strobe signal accurately accessing the test data.

12. The method as claimed in claim 1, wherein the step of generating the verification result comprises:
    offsetting the phase of the first data strobe signal and accessing the test data when it is verified that the test data is inaccurate; and
    recording a value of phase offset and then offsetting the phase of the first data strobe signal and accessing the test data when it is verified that the test data is accurate.

13. The method as claimed in claim 1, wherein the step of generating the target offset value comprises:
    recording a value of phase offset according to the verification result; and
    performing a numerical calculation on the recorded value of the phase offset to obtain the target offset value.

14. The method as claimed in claim 13, wherein the recorded value of the phase offset indicates a first phase offset of the first data strobe signal for accurately accessing the test data.

15. The method as claimed in claim 13, wherein the numerical calculation directly adds the recorded value of the phase offset by a predetermined value to obtain the target offset value.

16. The method as claimed in claim 13, wherein the step of generating the verification result comprises:

offsetting the phase of the first data strobe signal and accessing the test data when it is verified that the test data is inaccurate.

* * * * *